United States Patent
Nishioka et al.

(10) Patent No.: US 7,155,963 B2
(45) Date of Patent: Jan. 2, 2007

(54) CLEANING EVALUATION METHOD FOR A SUBSTRATE

(75) Inventors: Yukiko Nishioka, Tokyo (JP); Yoshikazu Ariga, Kanagawa-ken (JP)

(73) Assignee: Ebara Corporation, Tokyo (JP)

( * ) Notice: Subject to any disclaimer, the term of this patent is extended or adjusted under 35 U.S.C. 154(b) by 195 days.

(21) Appl. No.: 10/932,083

(22) Filed: Sep. 2, 2004

(65) Prior Publication Data
US 2005/0050946 A1 Mar. 10, 2005

(30) Foreign Application Priority Data
Sep. 4, 2003 (JP) ............................. 2003-312803

(51) Int. Cl.
*H01L 21/66* (2006.01)
*G01M 19/00* (2006.01)
(52) U.S. Cl. .......................................... 73/104; 438/14
(58) Field of Classification Search .................. 73/104; 438/14
See application file for complete search history.

(56) References Cited

U.S. PATENT DOCUMENTS 5,626,681 A * 5/1997 Nakano et al. ................ 134/3
6,614,050 B1 * 9/2003 Yamada et al. ............... 257/48
6,849,548 B1 * 2/2005 Cooper ...................... 438/692
6,899,592 B1 * 5/2005 Kojima et al. ................. 461/6
2002/0142617 A1 * 10/2002 Stanton ...................... 438/749
2004/0063227 A1 * 4/2004 Suzuki et al. ................. 438/14

FOREIGN PATENT DOCUMENTS

JP    5-291225    11/1993
JP    2000-51796   2/2000

* cited by examiner

Primary Examiner—Daniel S. Larkin
(74) Attorney, Agent, or Firm—Wenderoth, Lind & Ponack, L.L.P.

(57) ABSTRACT

The present invention relates to a cleaning evaluation method for evaluating a surface cleanliness of a substrate which has been cleaned after being polished. This method includes preparing a dummy substrate having a metal film formed on a surface thereof and a monitor substrate on which a cleaning evaluation is performed, and polishing the dummy substrate. After polishing the dummy substrate, the monitor substrate is polished without dressing a polishing surface of a polishing table, the monitor substrate is cleaned, and the surface cleanliness of the monitor substrate which has been cleaned is evaluated.

6 Claims, 8 Drawing Sheets

CLEANING EVALUATION METHOD FOR A SUBSTRATE

BACKGROUND OF THE INVENTION

1. Field of the Invention

The present invention relates to a cleaning evaluation method for a substrate, and more particularly to a method for evaluating a surface cleanliness of a substrate which has been cleaned after being polished in a semiconductor fabrication process.

2. Description of the Related Art

As semiconductor devices have become more highly integrated in recently years, circuit interconnects have become finer and distances between those interconnects have also become smaller. In order to enable an interconnect structure to be fine, it is necessary to flatten a surface of a semiconductor wafer having the interconnect structure formed thereon. Specifically, if a surface of the semiconductor wafer has irregularities whose heights are larger than a depth of focus of a stepper, high resolution cannot be obtained in an exposure process, and hence a fine interconnect pattern cannot be formed. For this reason, it has been practiced to polish a surface of a semiconductor wafer to flatten the surface with use of a polishing apparatus that performs a chemical mechanical polishing (CMP).

As shown in FIG. 7, this type of polishing apparatus (CMP apparatus) comprises a polishing table 302 having a polishing pad (e.g., a polishing cloth) 300 attached to an upper surface thereof, and a top ring 304 for holding a semiconductor wafer W, to be polished, in such a state that a surface to be polished faces the polishing table 302. An upper surface of the polishing pad 300 serves as a polishing surface 301. In this polishing apparatus, the polishing table 302 and the top ring 304 are independently rotated, and the semiconductor wafer W is pressed against the polishing surface 301 at a predetermined pressure by the top ring 304 while a polishing liquid (slurry) is supplied from a polishing liquid supply nozzle 306, disposed above the polishing table 302, onto the polishing surface 301.

The polishing liquid supplied from the polishing liquid supply nozzle 306 comprises, for example, alkaline solution in which fine abrasive grains, such as silica particles, are suspended. Thus, the semiconductor wafer W is chemically and mechanically polished to a flat mirror finish by a combination of a chemical polishing action of alkali and a mechanical polishing action of the abrasive grains. In recent years, a fixed abrasive comprising abrasive grains, such as cerium oxide ($CeO_2$), fixed together by a binder has also been used instead of the polishing pad (polishing cloth).

After the polishing apparatus performs a polishing process, a polishing capability of the polishing surface 301 of the polishing pad 300 is lowered. Therefore, in order to recover the polishing capability of the polishing surface 301, a dresser 308 having a dressing member 310 on a lower surface thereof is provided. This dresser 308 dresses the polishing surface 301 of the polishing pad 300 when replacing the polished semiconductor wafer W or at other timings. The dressing process is carried out as follows: The dresser 308 and the polishing table 302 are rotated independently while a dressing liquid, such as pure water, is supplied onto the polishing surface 301. Then, the dressing member 310 of the dresser 308 is pressed against the polishing surface 301, whereby the polishing liquid and shavings of polished material (e.g., Cu as interconnect material), each remaining on the polishing surface 301, are removed. At the same time, the polishing surface 301 is flattened and dressed, whereby the polishing surface 301 is regenerated. This dressing is also called conditioning.

After the polishing process is finished, the semiconductor wafer W is transferred to a non-illustrated cleaning device, so that the polishing liquid and the shavings of the polished material attached to the surface of the semiconductor wafer W are removed by the cleaning device. Thereafter, the semiconductor wafer W is transferred to a drying device, and is then dried by a spin-drying process or the like.

The abrasive grains contained in the polishing liquid (hereinafter referred to as particles), and the shavings of metal (i.e., interconnect material) and heavy metal component contained in the polishing liquid (hereinafter referred to as heavy metal) are known as a contaminant that has an adverse effect on the subsequent various processes. If the particles and the heavy metal remain on the surface of the semiconductor wafer, a subsequent film-forming process and an exposure process cannot be performed normally, and hence a pattern defect, such as a short circuit, is caused. Therefore, in the above-mentioned cleaning process using the cleaning device, it is required to sufficiently remove the contaminants from the semiconductor wafer in order to achieve a high surface cleanliness of the semiconductor wafer.

In order to check whether or not the contaminants have been sufficiently removed from a semiconductor wafer, a cleaning evaluation apparatus has been used for evaluating a surface cleanliness of a semiconductor wafer. As this type of cleaning evaluation apparatus, an optical inspection instrument utilizing scattered light of a laser light and an X-ray fluorescence analyzer utilizing fluorescence X-ray emitted from a specimen have been known. These cleaning evaluation apparatuses judge whether or not the contaminants, such as the particles, are removed from the surface of the semiconductor wafer to a degree less than or equal to an allowed value.

A semiconductor wafer on which the cleaning evaluation is to be performed is originally a substrate which has circuit patterns constituted by a metal (e.g., Cu) as an interconnect material, an insulating film (e.g., TEOS film or low-k film), and the like (hereinafter this substrate will be referred to as a patterned substrate). However, such a patterned substrate is rarely used in the cleaning evaluation process. In practice, a semiconductor wafer having only a TEOS film formed on a surface thereof is often used for the cleaning evaluation. This is because a technique for quickly and accurately evaluating a surface cleanliness of the patterned substrate has not been established yet.

Hereinafter, a conventional cleaning evaluation process for a semiconductor wafer will be described. First, a dummy substrate, which has a metal film (e.g., a Cu film) as an interconnect material formed on a surface thereof, is polished by a polishing apparatus. The dummy substrate is a substrate whose surface is covered with a metal film of the same kind as an interconnect material used in pattern formation. After the dummy substrate is polished, the polishing surface of the polishing pad is dressed (conditioned), so that shavings of the metal film and the polishing liquid are removed from the polishing surface. The polished dummy substrate is transferred to the cleaning device and then cleaned, and is further transferred to the drying device and then dried. In this manner, a plurality of (e.g., three) dummy substrates are polished by the polishing apparatus. Thereafter, a semiconductor wafer serving as an object of the cleaning evaluation (hereinafter, referred to as a monitor substrate) is polished by the polishing apparatus. The monitor substrate is a substrate having an oxide film formed on a surface thereof. The monitor substrate which has been polished is transferred to the cleaning device and then cleaned, and is further transferred to the drying device and then dried. The monitor substrate, which has been processed in this manner, is transferred from the polishing apparatus to the cleaning evaluation apparatus. This cleaning evaluation apparatus measures an amount of contaminants, such as particles and heavy metal, remaining on the oxide film of the monitor substrate, and judges whether or not these contaminants are removed to a degree less than or equal to an allowed value.

However, the above-mentioned conventional cleaning evaluation process includes the following problems:

First, if the polishing surface of the polishing pad is dressed (conditioned) before the monitor substrate is polished, the shavings of the metal film of the dummy substrate remaining on the polishing surface (hereinafter such shavings will be referred to as metal contaminants) are removed to a certain degree, and hence an amount of metal contaminants attached to the surface of the monitor substrate that is subsequently polished is reduced. Accordingly, a state of existence of the metal contaminants on the surface of the monitor substrate is different from that of the metal contaminants in the case of the polished patterned substrate. Specifically, after the patterned substrate is polished, the shavings of the metal constituting the circuit pattern are generally present on the surface of the patterned substrate. However, if the polishing surface is dressed before the monitor substrate having only the oxide film is polished, this monitor substrate is polished in the presence of a small amount of metal contaminants. Accordingly, a different state of existence of the metal contaminants is created on the polished monitor substrate compared with the patterned substrate. As a result, the cleaning evaluation apparatus cannot perform an accurate cleaning evaluation.

Second, it is relatively difficult to obtain a low-k film which is expected to serve as an insulating film for Cu interconnects, and hence a substrate having an oxide film (e.g., a TEOS film) is used as the monitor substrate, as described above. However, there is a difference in the remaining amount of the metal contaminants between the oxide film and the low-k film even when the substrate is polished under the same condition. FIG. 8 is a graph illustrating amounts of the metal contaminants remaining on the low-k film and the TEOS film. In FIG. 8, the ordinate represents the number of atoms of the metal contaminants per 1 $cm^2$, and reference signs A through O arranged along an axis of the abscissa represent samples. As shown in FIG. 8, there is a large difference between the amount of the metal contaminants remaining on the TEOS film and the amount of the metal contaminants remaining on the low-k film. Accordingly, if the monitor substrate having an oxide film, such as a TEOS film, is used when intending to evaluate a cleanliness of the low-k film, an accurate result of the cleaning evaluation cannot be obtained.

SUMMARY OF THE INVENTION

The present invention has been made in view of the above drawbacks. It is therefore an object of the present invention to provide a cleaning evaluation method which can perform an accurate cleaning evaluation on a substrate.

In order to achieve the above object, according to one aspect of the present invention, there is provided a cleaning evaluation method for evaluating a surface cleanliness of a substrate which has been cleaned after being polished, comprising: preparing a dummy substrate having a metal film formed on a surface thereof and a monitor substrate on which a cleaning evaluation is performed; polishing the dummy substrate; after polishing the dummy substrate, polishing the monitor substrate without dressing a polishing surface of a polishing table; cleaning the monitor substrate; and evaluating the surface cleanliness of the monitor substrate which has been cleaned.

In a preferred aspect of the present invention, a film being an object of the cleaning evaluation is formed on a surface of the monitor substrate.

In a preferred aspect of the present invention, the film formed on the surface of the monitor substrate is a low-k film.

In a preferred aspect of the present invention, a plurality of the monitor substrates are used for the cleaning evaluation.

In a preferred aspect of the present invention, at least one of the plurality of the monitor substrates has a metal film which is an object of the cleaning evaluation.

In a preferred aspect of the present invention, the metal film is a Cu film.

According to the present invention, since the polishing surface is not dressed after the dummy substrate is polished, shavings (metal contaminants) of the dummy substrate are allowed to remain on the polishing surface. Hence, the metal contaminants are attached to the surface of the monitor substrate which is polished subsequently to the dummy substrate. Accordingly, the cleaning evaluation can be performed in a condition similar to the case where a patterned substrate is polished. Therefore, an accurate result of the cleaning evaluation can be obtained. Further, according to the present invention, the monitor substrate has a film whose cleanliness is to be originally evaluated, e.g., a film of the same kind as that used in the patterned substrate. Accordingly, a more accurate result of the cleaning evaluation can be obtained.

DETAILED DESCRIPTION OF THE PREFERRED EMBODIMENTS

A cleaning evaluation method for a substrate according to an embodiment of the present invention will be described below with reference to the drawings.

Figure 1:
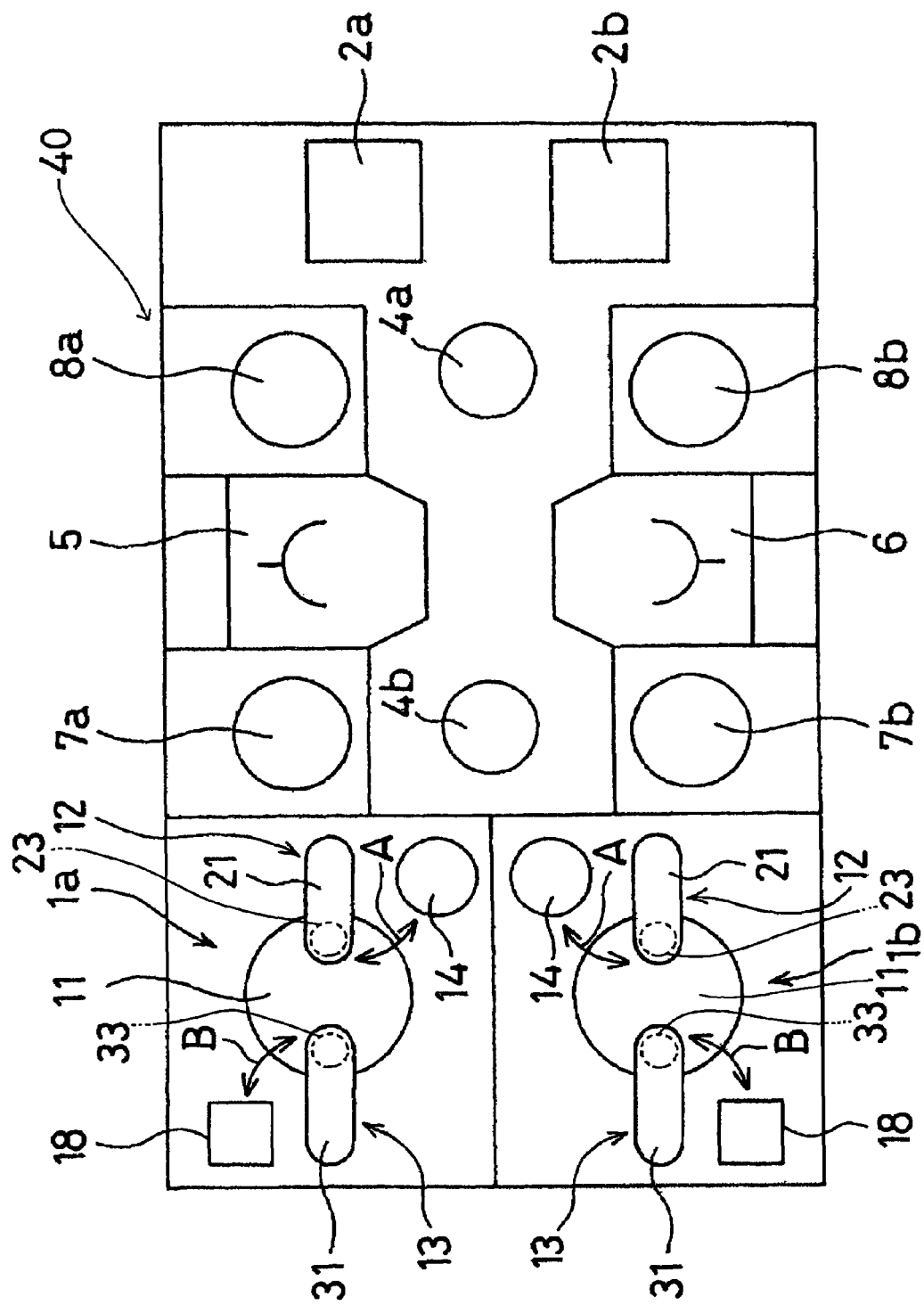
FIG. 1 is a plan view schematically showing a general polishing apparatus.

FIG. 1 is a plan view schematically showing a general polishing apparatus. As shown in FIG. 1, a polishing apparatus 40 comprises a pair of polishing sections 1a and 1b for polishing a semiconductor wafer, a pair of cleaning devices 7a and 7b for cleaning the polished semiconductor wafer, and a pair of cleaning devices 8a and 8b for further cleaning and drying the semiconductor wafer which has been cleaned by the cleaning devices 7a and 7b.

In this polishing apparatus 40, the polishing sections 1a and 1b are disposed on one side of a rectangular floor so as to face each other. A pair of load/unload units 2a and 2b, each for placing a cassette (not shown in the drawing) thereon which accommodates a plurality of semiconductor wafers therein, is disposed on the other side of the floor. Transfer robots 4a and 4b for transferring a semiconductor wafer are disposed on a line connecting the polishing sections 1a and 1b to the load/unload units 2a and 2b, thus forming a transfer line. On both sides of this transfer line, there are disposed reversing devices 5 and 6 for reversing a semiconductor wafer, the cleaning devices 7a and 7b, and the cleaning devices 8a and 8b. The reversing device 5 is disposed between the cleaning device 7a and the cleaning device 8a, and the reversing device 6 is disposed between the cleaning device 7b and the cleaning device 8b.

The polishing sections 1a and 1b have basically the same structure as each other. Each of the polishing sections 1a and 1b comprises a polishing table 11 having a polishing surface on an upper surface thereof, a top ring unit 12 for holding a semiconductor wafer, to be polished, by vacuum suction and pressing the semiconductor wafer against the polishing surface of the polishing table 11, and a dressing unit 13 for dressing (conditioning) the polishing surface of the polishing table 11. Each of the polishing sections 1a and 1b further comprises a pusher 14 for allowing the semiconductor wafer to be transferred between the top ring unit 12 and the transfer robot 4b. The pusher 14 is positioned at the side of the transfer line.

Each of the transfer robots 4a and 4b has an articulated arm being bendable and stretchable in a horizontal plane and having upper and lower holders which are respectively used as a dry finger and a wet finger. The reversing devices 5 and 6 are disposed in such a position that the articulated arms of the transfer robots 4a and 4b can reach the reversing devices 5 and 6.

The cleaning devices 7a and 7b and the cleaning devices 8a and 8b may be of any type. In this embodiment, the cleaning devices 7a and 7b at the side of the polishing sections 1a and 1b are of a type that wipes both surfaces of a semiconductor wafer with rollers having sponges, and the cleaning devices 8a and 8b at the side of the load/unload units 2a and 2b are of a type that holds an edge (circumferential portion) of a semiconductor wafer and rotates the semiconductor wafer in a horizontal plane while supplying a cleaning liquid to the semiconductor wafer. The cleaning devices 8a and 8b also function as a drying device for centrifugally dehydrating and thus drying a semiconductor wafer. With this arrangement, the cleaning devices 7a and 7b can perform a primary cleaning process on the semiconductor wafer, and the cleaning devices 8a and 8b can perform a secondary cleaning process on the semiconductor wafer after the primary cleaning process.

Figure 2:
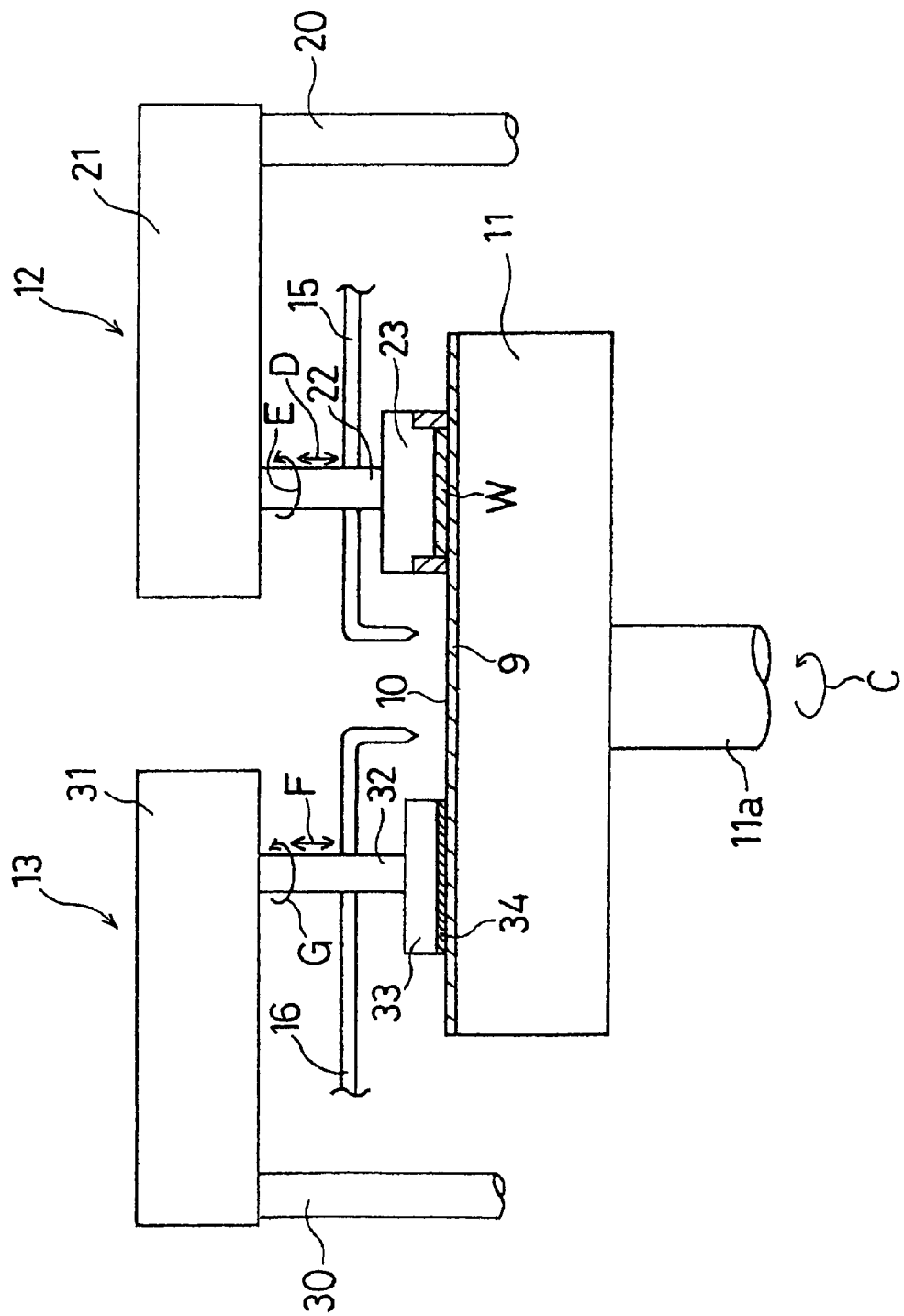
FIG. 2 is a schematic view showing an essential part of a polishing section incorporated in the polishing apparatus shown in FIG. 1.

Next, the above-mentioned polishing sections 1a and 1b will be described in detail. FIG. 2 is a schematic view showing an essential part of the polishing section 1a or 1b shown in FIG. 1. Although only the polishing section 1a will be described below, the polishing section 1b also has the same structure as the polishing section 1a.

As shown in FIG. 2, the polishing section 1a comprises the polishing table 11 having the polishing surface 10 on the upper surface thereof, the top ring unit 12 for holding a semiconductor wafer W, to be polished, by vacuum suction and pressing the semiconductor wafer W against the polishing table 11 so as to polish the semiconductor wafer W, and the dressing unit 13 for dressing (conditioning) the polishing surface 10 on the polishing table 11. The polishing table 11 is coupled to a motor (not shown) by a table shaft 11a, so that the polishing table 11 is rotated about the table shaft 11a in a direction indicated by the arrow C in FIG. 2. The polishing surface 10 serving to polish the semiconductor wafer W is constituted by a polishing pad (e.g., a polishing cloth) 9. Examples of such a polishing cloth include a foamed polyurethane and a non-woven fabric, each containing no abrasive grain therein.

A polishing liquid supply nozzle 15 and a dressing liquid supply nozzle 16 are disposed above the polishing table 11. The polishing liquid supply nozzle 15 supplies a polishing liquid onto the polishing surface 10 on the polishing table 11. The dressing liquid supply nozzle 16 supplies a dressing liquid (e.g., pure water) onto the polishing surface 10 on the polishing table 11.

The top ring unit 12 comprises a rotatable support shaft 20, a swing arm 21 coupled to an upper end of the support shaft 20, a top ring shaft 22 extending downwardly from a free end of the swing arm 21, and a substantially disk-like top ring 23 coupled to a lower end of the top ring shaft 22. When the swing arm 21 is swung by the rotation of the support shaft 20, the top ring 23 is moved horizontally. Thus, the top ring 23 can be reciprocated between the pusher 14 and a polishing position on the polishing surface 10, as indicated by the arrow A in FIG. 1. Further, the top ring 23 is coupled through the top ring shaft 22 to a motor (not shown) and an elevating/lowering cylinder (not shown) provided in the swing arm 21, so that the top ring 23 is vertically movable and is rotatable about the top ring shaft 22, as indicated by the arrows D and E in FIG. 2. The semiconductor wafer W to be polished is attracted to and held by the lower surface of the top ring 23 due to vacuum suction. With the above mechanisms, the top ring 23 presses the semiconductor wafer W held by the lower surface thereof against the polishing surface 10, which is being rotated, under a desired pressure while being rotated about the top ring shaft 22, thereby polishing the semiconductor wafer W.

The dressing unit 13 comprises a rotatable support shaft 30, a swing arm 31 coupled to an upper end of the support shaft 30, a dresser shaft 32 extending downwardly from a free end of the swing arm 31, and a dresser 33 coupled to a lower end of the dresser shaft 32. When the swing arm 31 is swung by the rotation of the support shaft 30, the dresser 33 is moved horizontally and can thus be reciprocated between a dressing position on the polishing surface 10 and a dresser cleaning device 18 disposed outwardly of the polishing table 11, as indicated by the arrow B in FIG. 1.

As show in FIG. 2, a dressing member 34 is provided on a lower surface of the dresser 33. This dressing member 34 is brought into sliding contact with the polishing surface 10 to dress the polishing surface 10. Specifically, the dresser 33 presses the dressing member 34 against the polishing surface 10, which is being rotated, under a desired pressure while being rotated about the dresser shaft 32 for thereby performing the dressing (conditioning) on the polishing surface 10. The dressing member 34 has diamond particles attached to a lower surface thereof by electrodeposition or welding.

Next, operation of the above-mentioned polishing apparatus will be described with reference to FIGS. 1 and 2.

In FIG. 1, a plurality of semiconductor wafers, each having circuit patterns constituted by Cu as an interconnect material and a low-k film as an insulating film, are accommodated in the cassette. This cassette is placed on the load/unload unit 2a (and/or the load/unload unit 2b). The transfer robot 4a removes one of the semiconductor wafers from the cassette of the load/unload unit 2a, and transfers the semiconductor wafer to the reversing device 5. If necessary, the reversing device 5 reverses the semiconductor wafer so that a surface having the circuit patterns faces downwardly. Subsequently, the transfer robot 4b transfers the semiconductor wafer from the reversing device 5 to the pusher 14 of the polishing section 1a, and places the semiconductor wafer onto the pusher 14. The swing arm 21 is swung to bring the top ring 23 to a position above the pusher 14. Then, the pusher 14 is elevated so as to allow the top ring 23 to attract the semiconductor wafer placed on the pusher 14 to the lower surface thereof. Thereafter, with the semiconductor wafer being held by the top ring 23, the swing arm 21 is swung to bring the top ring 23 to a position above the polishing table 11.

Subsequently, the top ring 23 is lowered to press the semiconductor wafer W, which is held by the top ring 23, against the polishing surface 10 of the polishing table 11 under a predetermined pressing force (see FIG. 2). In this state, the polishing table 11 and the top ring 23 are rotated, and the polishing liquid is supplied from the polishing liquid supply nozzle 15 onto the polishing surface 10, whereby the surface (i.e., the lower surface) of the semiconductor wafer W is polished chemically and mechanically. When a film-thickness sensor (not shown) detects that a film thickness of Cu formed on the semiconductor wafer W reaches a predetermined value, the top ring 23 is elevated. At the same time or after that, rotations of the polishing table 11 and the top ring 23 are stopped and supply of the polishing liquid is also stopped, whereby the polishing of the semiconductor wafer W is finished.

After the polishing, the swing arm 21 is swung to bring the top ring 23 holding the polished semiconductor wafer to a position above the pusher 14. The semiconductor wafer is transferred from the top ring 23 to the pusher 14, and is further transferred from the pusher 14 to the cleaning device 7a by the transfer robot 4b. The cleaning device 7a cleans the semiconductor wafer so as to remove the shavings of Cu and the polishing liquid attached to the surface of the semiconductor wafer. After the cleaning, the semiconductor wafer is transferred to the reversing device 5 by the transfer robot 4b, and if necessary, the semiconductor wafer is reversed by the reversing device 5. Thereafter, the semiconductor wafer is transferred to the cleaning device 8a by the transfer robot 4a. The cleaning device 8a further cleans the semiconductor wafer and then dries the semiconductor wafer by centrifugal dehydration. The semiconductor wafer which has been dried by the cleaning device 8a is returned to the cassette of the load/unload unit 2a by the transfer robot 4a.

In the polishing section 1a, the polishing surface 10 is dressed between the time when the polishing of the semiconductor wafer is finished and the time when the next semiconductor wafer is transferred to the polishing section 1a. In this dressing process, as shown in FIG. 2, while the dresser 33 and the polishing table 11 are rotated independently of each other, the dressing member 34 is brought into close contact with the polishing surface 10 under a predetermined pressing force. At the same time or before the dressing member 34 is brought into contact with the polishing surface 10, the dressing liquid (e.g., pure water) is supplied from the dressing liquid supply nozzle 16 onto the polishing surface 10, so that the shavings of Cu and the polishing liquid remaining on the polishing surface 10 are washed out and at the same time the polishing surface 10 is regenerated. After the dressing, the dresser 33 is returned to a standby position by actuating the swing arm 31, and is then cleaned by the dresser cleaning device 18 (see FIG. 1) disposed at the standby position.

In this polishing apparatus, a sequence of processes described above is repeated successively. Specifically, a plurality of the semiconductor wafers accommodated in the cassette of the load/unload unit 2a are successively transferred to the polishing section 1a, the cleaning device 7a, and the cleaning device 8a at predetermined time intervals. The polishing apparatus of this embodiment can also process a plurality of semiconductor wafers accommodated in the cassette of the load/unload unit 2b simultaneously. Specifically, the semiconductor wafers which have been set in the load/unload unit 2b are successively transferred to the polishing section 1b, the cleaning device 7b, and the cleaning device 8b at predetermined time intervals, so that a sequence of processes described above is performed while the semiconductor wafers set in the load/unload unit 2a are being processed.

Figure 3:
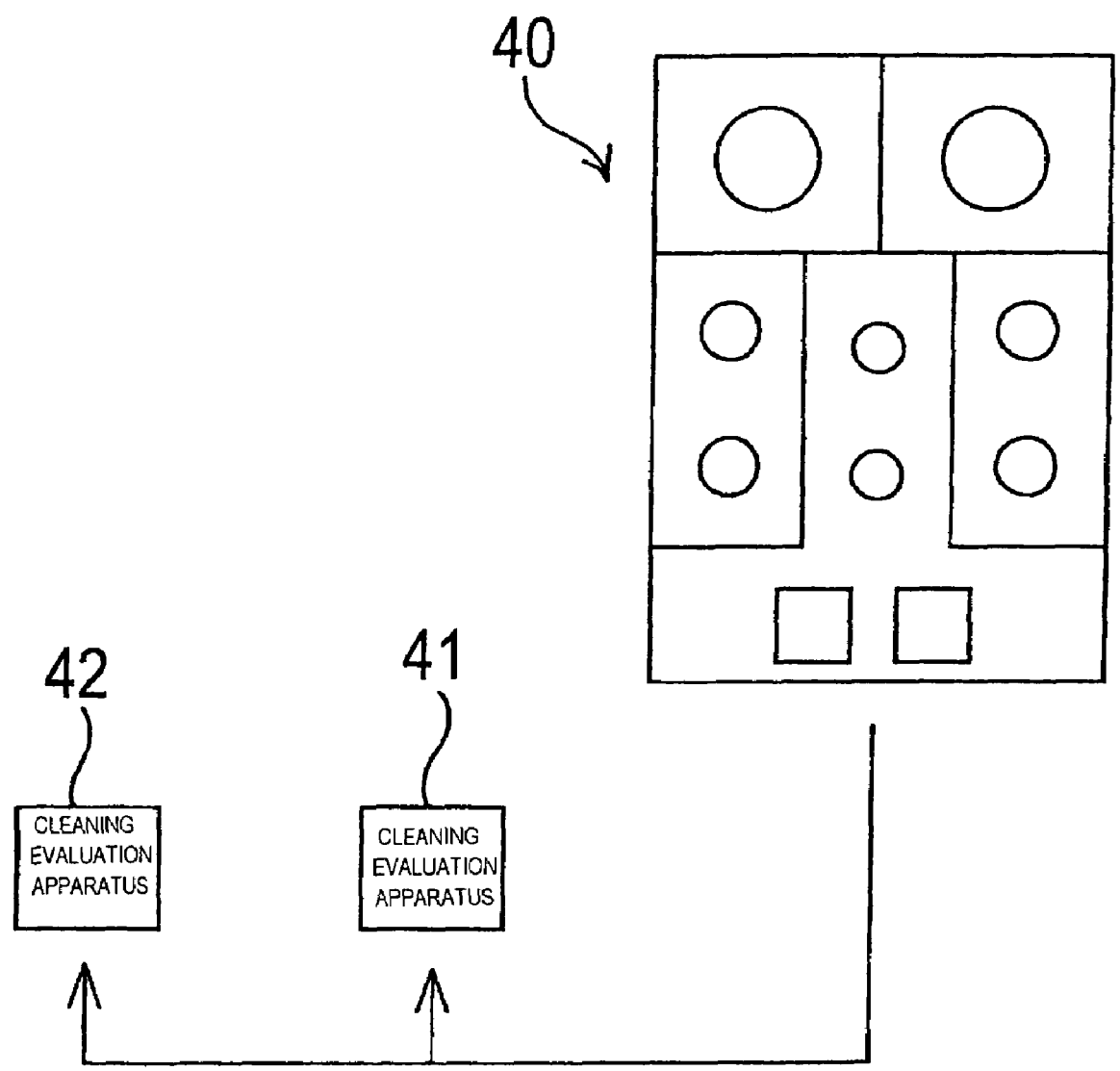
FIG. 3 is a schematic view showing a cleaning evaluation apparatus for performing a cleaning evaluation on a substrate and the polishing apparatus shown in FIG. 1.

FIG. 3 is a schematic view showing a cleaning evaluation apparatus for performing a cleaning evaluation on a substrate such as a semiconductor wafer and also showing the polishing apparatus shown in FIG. 1.

As shown in FIG. 3, the semiconductor wafer which has been polished, cleaned, and dried by the polishing apparatus 40 is transferred to one of two cleaning evaluation apparatuses 41 and 42 by a non-illustrated transfer device. One of the two cleaning evaluation apparatuses 41 and 42 is an optical inspection instrument utilizing scattered laser light, and the other is an X-ray fluorescence analyzer utilizing fluorescence X-rays emitted from a specimen (i.e., a contaminant). Hereinafter, the optical inspection instrument will be represented by the reference numeral 41 and the X-ray fluorescence analyzer will be represented by the reference numeral 42.

The optical inspection instrument 41 comprises a laser device for irradiating the surface of the semiconductor wafer with a laser light, and a light detector disposed at a location deviated from a path of the reflected laser light. When the particles are present on the surface of the semiconductor wafer, the laser light emitted from the laser device is scattered by the particles and thus the scattered light is detected by the light detector. In this manner, the optical inspection instrument 41 detects the particles present on the surface of the semiconductor wafer.

The X-ray fluorescence analyzer 42 comprises an X-ray device for irradiating the surface of the semiconductor wafer with X-rays, and a semiconductor detector disposed so as to face the surface of the semiconductor wafer. When the heavy metal attached to the surface of the semiconductor wafer is irradiated with the X-rays, fluorescence X-rays are emitted from the heavy metal and these fluorescence X-rays are detected by the semiconductor detector. An energy level of the fluorescence X-rays varies depending on the kind of element of the heavy metal. The X-ray fluorescence analyzer 42 measures the energy level of the fluorescence X-rays for thereby detecting the kind of heavy metal and performing quantitative analysis of the heavy metal.

In this manner, the cleaning evaluation apparatuses (i.e., the optical inspection instrument 41 and the X-ray fluorescence analyzer 42) detect the contaminants such as the particles and the heavy metal, and measure an amount of the contaminants remaining on the surface of the semiconductor wafer serving as an object of the cleaning evaluation. Further, the optical inspection instrument 41 and the X-ray fluorescence analyzer 42 judge whether or not the contaminants are removed to a degree less than or equal to an allowed value, so that the surface cleanliness of the semiconductor wafer is evaluated. The cleaning evaluation apparatus is not limited to the optical inspection instrument and the X-ray fluorescence analyzer described above, and another type of cleaning evaluation apparatus can be used.

Next, the cleaning evaluation method of this embodiment will be described with reference to FIG. 4.

Figure 4:
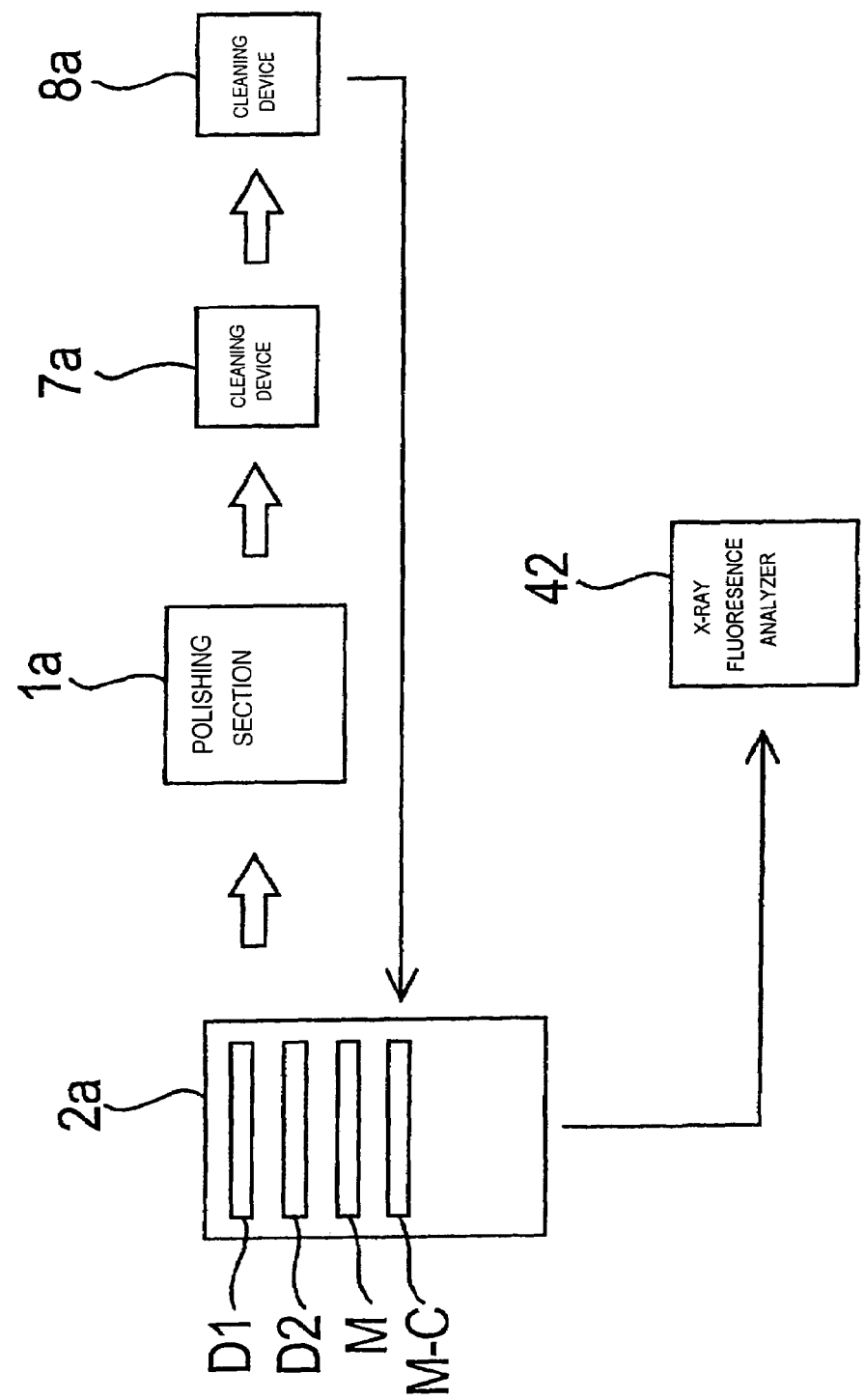
FIG. 4 is a schematic view illustrating a cleaning evaluation method according to an embodiment of the present invention.

FIG. 4 is a schematic view illustrating the cleaning evaluation method according to the present embodiment.

A semiconductor wafer on which the cleaning evaluation is to be performed is originally a patterned substrate having circuit patterns constituted by Cu and low-k material. However, in the cleaning evaluation method of the present embodiment, a semiconductor wafer having only a low-k film formed on its surface to be polished (hereinafter referred to as a monitor substrate M) is used for the cleaning evaluation. The object of the cleaning evaluation method of this embodiment is to measure an amount of the contaminants remaining on the low-k film of the monitor substrate M, which has been cleaned, to evaluate a cleanliness of the monitor substrate M. Two dummy substrates D1 and D2, each of which has only a Cu film formed on its surface to be polished, are used together with the monitor substrate M. The dummy substrate is a substrate whose surface (to be polished) is covered with a metal film of the same kind as an interconnect material used in the patterned substrate. The number of dummy substrates to be used in the cleaning evaluation method of the present embodiment is not limited to two. That is, only one dummy substrate may be used, or three or more dummy substrates may also be used.

In a case of evaluating a surface cleanliness of a patterned substrate having circuit patterns constituted by Cu and low-k material, a semiconductor wafer having only a Cu film formed on its surface to be polished is also used as another monitor substrate (hereinafter referred to as a monitor substrate M-C). This is because the semiconductor wafer having only a Cu film (i.e., the monitor substrate M-C) serves as a pseudo-wafer for use in evaluating the cleanliness of the Cu interconnect region of the patterned substrate, and the semiconductor wafer having only a low-k film (i.e., the monitor substrate M) serves as a pseudo-wafer for use in evaluating the cleanliness of the low-k film region of the patterned substrate.

In FIG. 4, two dummy substrates D1 and D2, and the monitor substrates M and M-C, as the object of the cleaning evaluation, are accommodated in the cassette in the load/unload unit 2a. First, the dummy substrate D1 is removed from the load/unload unit 2a by the transfer robot 4a (see FIG. 1). This dummy substrate D1 is transferred to the polishing section 1a by the transfer robots 4a and 4b and then polished by the polishing section 1a. Thereafter, the dummy substrate D1 is cleaned and dried by the cleaning device 7a and the cleaning device 8a, and is then accommodated in the load/unload unit 2a. After the dummy substrate D1 is polished in the polishing section 1a, the polishing surface 10 (see FIG. 2) is dressed by the dresser 33 before the subsequent dummy substrate D2 is polished, as usual.

Next, the dummy substrate D2 is transferred to the polishing section 1a and then polished, and the polished dummy substrate D2 is cleaned and dried by the cleaning device 7a and the cleaning device 8a, as with the dummy substrate D1. Normally, after a substrate is polished in the polishing section 1a, the polishing surface 10 is dressed by the dresser 33. However, in this cleaning evaluation method, the polishing surface 10 is not dressed after the dummy substrate D2 is polished.

Figure 5:
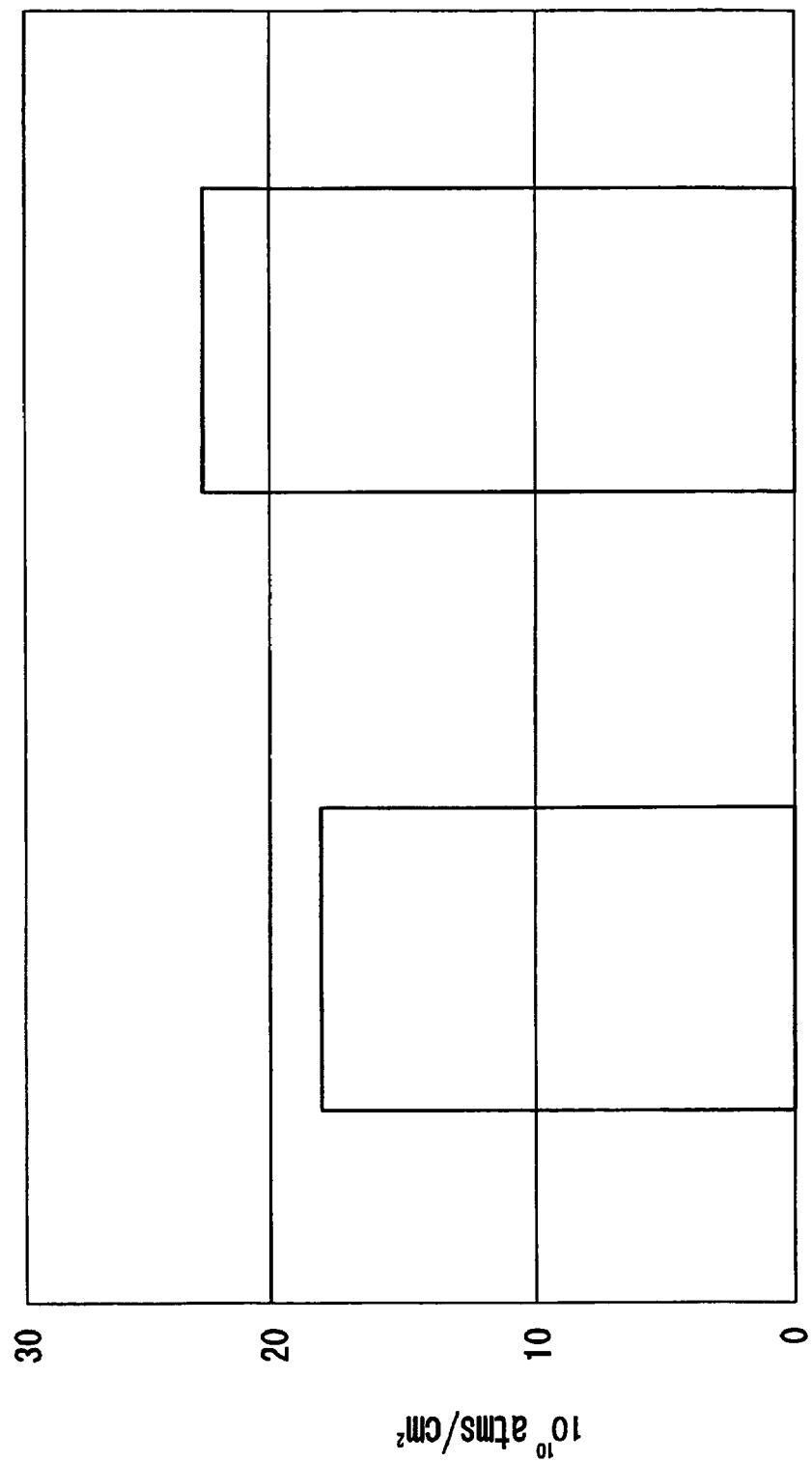
FIG. 5 is a graph comparing remaining amounts of metal contaminants in the case where a dressing process is performed and in the case where the dressing process is not performed.

FIG. 5 is a graph comparing the remaining amounts of metal contaminants in the case where the dressing process is performed and in the case where the dressing process is not performed. In FIG. 5, the ordinate represents the number of atoms of the metal contaminants per 1 cm$^2$. As shown in FIG. 5, the number of atoms in the case where the dressing process is not performed is larger than that in the case where the dressing process is performed. In this embodiment, since the dressing process is not performed after the dummy substrate D2 is polished, the shavings of Cu (the metal contaminants), which are produced by polishing the dummy substrate D2, are allowed to remain on the polishing surface 10 intentionally. After the dummy substrate D2 is polished, the monitor substrate M is polished in the polishing section 1a, as with the above case. At this time, the metal contaminants (Cu) remaining on the polishing surface 10 are attached to the surface of the monitor substrate M, and the monitor substrate M is polished in the presence of the metal contaminants.

The monitor substrate M which has been polished is transferred to the cleaning device 7a and the cleaning device 8a with the metal contaminants and particles (e.g., abrasive grains) attached to the polished surface, and is then cleaned and dried. In this manner, even when the patterned substrate is not used as the monitor substrate, it is possible to create a state in which the metal contaminants are present on the surface of the monitor substrate M by not performing the dressing process after polishing the dummy substrate D2, i.e., the dummy substrate to be polished immediately before the monitor substrate. Accordingly, the monitor substrate M can be polished in a condition similar to the case where the patterned substrate is polished.

As described above, the monitor substrate M which has been polished in the polishing section 1a is transferred to the cleaning device 7a and the cleaning device 8a, and is then cleaned and dried, as with the dummy substrates D1 and D2. Thereafter, the monitor substrate M is accommodated in the cassette of the load/unload unit 2a. After the monitor substrate M is polished, the polishing surface 10 is dressed as usual. Next, the monitor substrate M-C is polished by the polishing section 1a and then cleaned and dried by the cleaning device 7a and the cleaning device 8a, as with the monitor substrate M. The dried monitor substrate M-C is accommodated in the cassette of the load/unload unit 2a.

Then, the monitor substrate M is transferred from the load/unload unit 2a to the X-ray fluorescence analyzer 42 by the non-illustrated transfer device, and the cleaning evaluation is performed on the monitor substrate M by the X-ray fluorescence analyzer 42. This X-ray fluorescence analyzer 42 detects the heavy metal (i.e., the shavings of Cu and the heavy metal component contained in the polishing liquid) remaining on the surface of the monitor substrate M, and judges whether or not an amount of the heavy metal is less than or equal to the allowed value. In this manner, the surface cleanliness of the monitor substrate M which has been cleaned is evaluated by the X-ray fluorescence analyzer 42.

The monitor substrate M-C is transferred to the optical inspection instrument 41, and the cleaning evaluation is performed on the monitor substrate M-C by the optical inspection instrument 41. The monitor substrate M, which has been polished, cleaned, and dried by the polishing apparatus 40, may be transferred to the optical inspection instrument 41. The optical inspection instrument 41 measures an amount of foreign matters, such as the particles, remaining on the surface of the monitor substrates M-C and M, and judges whether or not the amount is less than or equal to the allowed value. In this manner, the surface cleanliness of the monitor substrates M-C and M which have been cleaned is evaluated by the optical inspection instrument 41.

Figure 6:
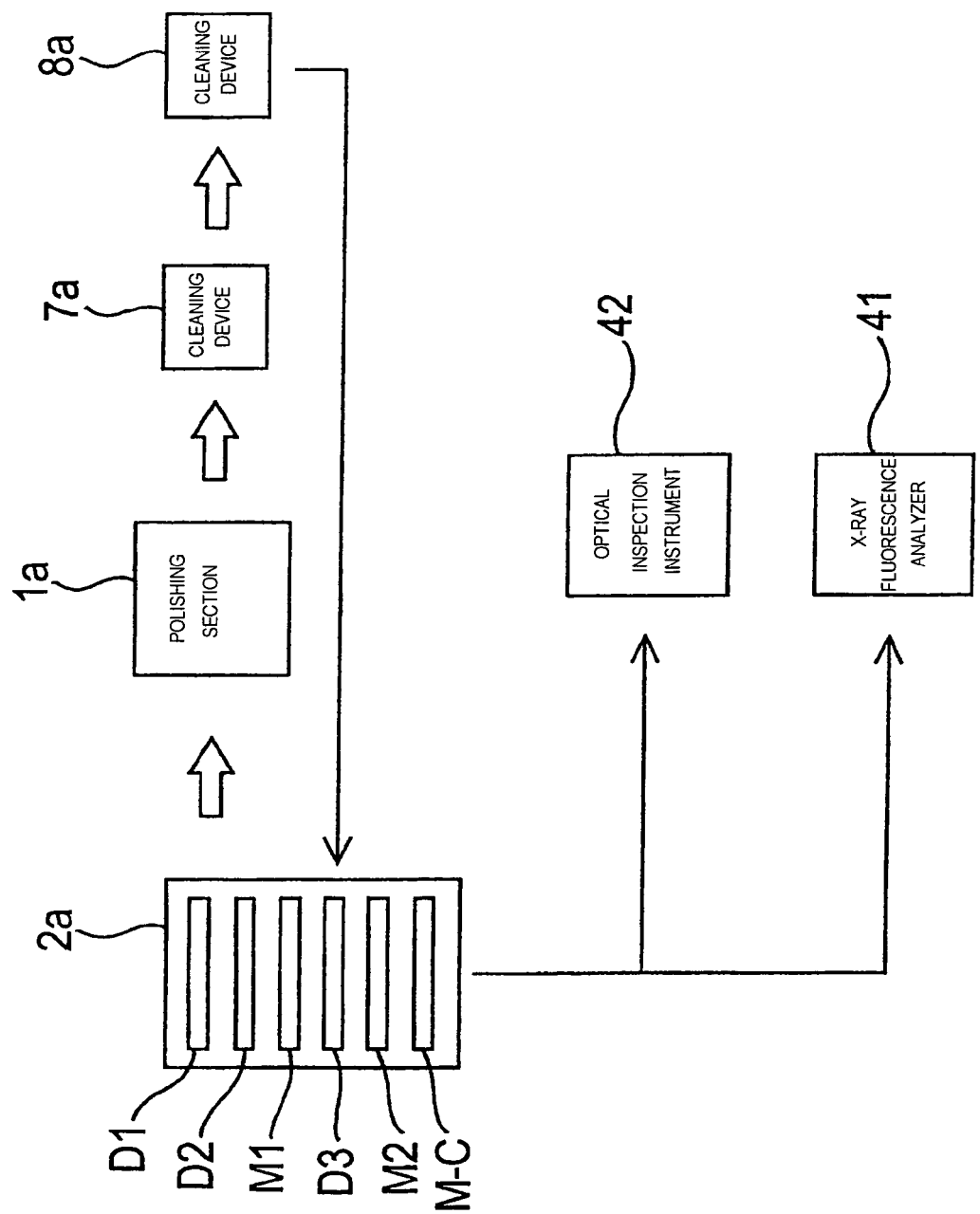
FIG. 6 is a schematic view illustrating another example of the cleaning evaluation method according to the embodiment of the present invention.
Figure 7:
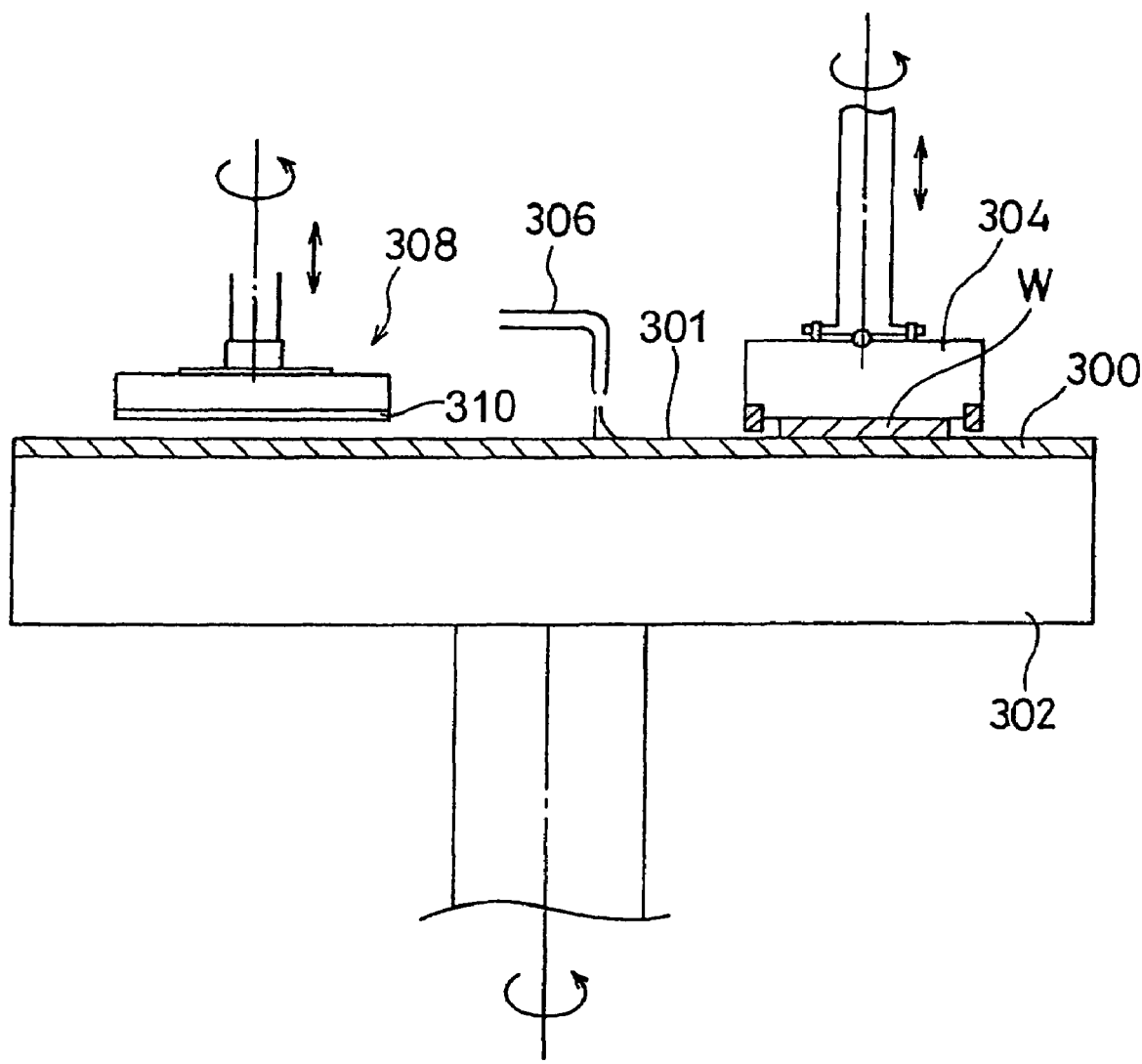
FIG. 7 is a schematic view showing an essential part of a general polishing apparatus.
Figure 8:
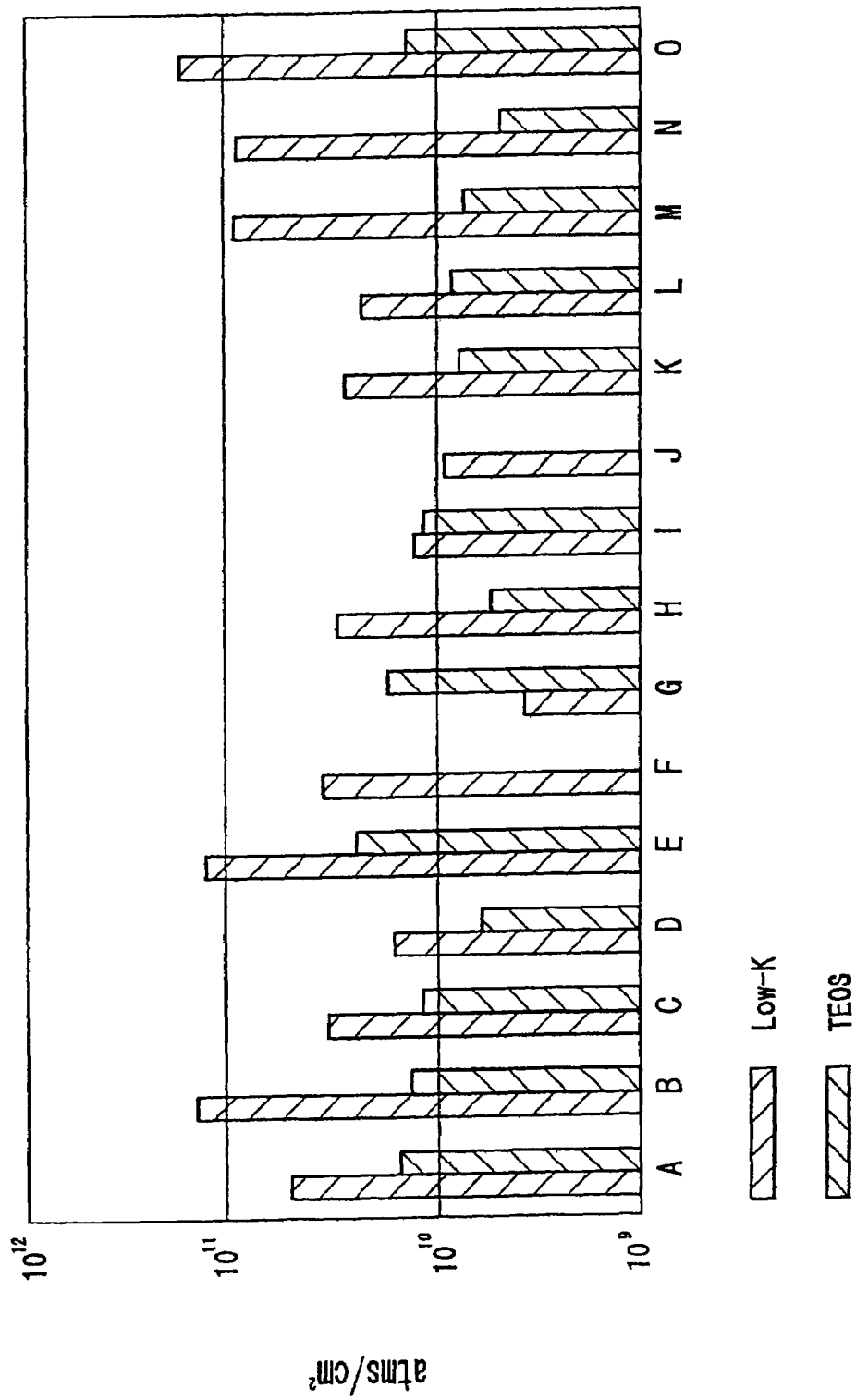
FIG. 8 is a graph illustrating amounts of metal contaminants remaining on a low-k film and a TEOS film.

A plurality of monitor substrates may be used in measuring both the remaining amount of the particles (i.e., the foreign matters) and the remaining amount of the heavy metal. In this case, as shown in FIG. 6, the dummy substrates D1 and D2 (or single dummy substrate), a first monitor substrate M1, a dummy substrate D3 (or a plurality of dummy substrates), a second monitor substrate M2, and the monitor substrate M-C are set in the load/unload unit 2a. Next, the dummy substrates D1 and D2, the first monitor substrate M1, the dummy substrate D3, the second monitor substrate M2, and the monitor substrate M-C are transferred, in this order, to the polishing section 1a, the cleaning device 7a, and the cleaning device 8a, so that the respective processes are performed on these substrates. In this case also, after the dummy substrates D2 and D3 (to be polished immediately before the first and second monitor substrates M1 and M2) are polished, the polishing surface 10 (see FIG. 2) is not dressed. Then, the optical inspection instrument 41 performs the cleaning evaluation on the first monitor substrate M1, and the X-ray fluorescence analyzer 42 performs the cleaning evaluation on the second monitor substrate M2 and the monitor substrate M-C.

If an adverse effect, such as back contamination (secondary pollution) or deterioration, on the monitor substrate is not observed in at least one of the optical inspection instrument 41 and the X-ray fluorescence analyzer 42 after the cleaning evaluation is performed, a single monitor substrate can be used for the cleaning evaluation in such a manner that the monitor substrate is transferred successively to the optical inspection instrument 41 and the X-ray fluorescence analyzer 42. Specifically, the monitor substrate M may be transferred to one of the optical inspection instrument 41 and the X-ray fluorescence analyzer 42, so that the cleaning evaluation is performed on the monitor substrate M. Subsequently, the monitor substrate M is transferred to the other, so that the cleaning evaluation is further performed on the monitor substrate M. In this manner, the single monitor substrate can be used for measuring both the remaining amount of the particles (i.e., the foreign matters) and the remaining amount of the heavy metal.

As described above, according to the present invention, because the dressing process is not performed after polishing the dummy substrate which is to be polished immediately before the monitor substrate is polished, the monitor substrate can be polished in a condition similar to the case where the patterned substrate is polished. Therefore, the surface cleanliness of the substrate which has been cleaned can be evaluated accurately. Further, because the monitor substrate has a film on which the cleaning evaluation is to be originally performed (e.g., an insulating film for use in the patterned substrate), the cleaning evaluation can be performed more accurately.

Although certain preferred embodiments of the present invention have been shown and described in detail, it should be understood that various changes and modifications may be made therein without departing from the scope of the appended claims.

What is claimed is:

1. A cleaning evaluation method for evaluating a surface cleanliness of a substrate which has been cleaned after being polished, comprising:
   preparing a dummy substrate having a metal film formed on a surface thereof and a monitor substrate on which a cleaning evaluation is performed;
   polishing the dummy substrate;
   after polishing the dummy substrate, polishing the monitor substrate without dressing a polishing surface of a polishing table;
   cleaning the monitor substrate; and
   evaluating the surface cleanliness of the monitor substrate which has been cleaned.

2. A cleaning evaluation method according to claim 1, wherein a film which is an object of the cleaning evaluation is formed on a surface of the monitor substrate.

3. A cleaning evaluation method according to claim 2, wherein the film formed on the surface of the monitor substrate is a low-k film.

4. A cleaning evaluation method according to claim 1, wherein a plurality of the monitor substrates are used for the cleaning evaluation.

5. A cleaning evaluation method according to claim 4, at least one of the plurality of the monitor substrates has a metal film which is an object of the cleaning evaluation.

6. A cleaning evaluation method according to claim 5, wherein the metal film is a Cu film.

* * * * *